United States Patent [19]
Takahashi et al.

[11] Patent Number: 5,153,427
[45] Date of Patent: Oct. 6, 1992

[54] OPTICAL D.C. VOLTAGE TRANSFORMER

[75] Inventors: Genji Takahashi; Kazuyuki Seino; Sadamu Saito, all of Hitachi; Tadashi Sato, Mito; Etsunori Mori, Hitachi; Kiyoshi Kurosawa, Tokyo; Yoshinori Shirai, Yokohama, all of Japan

[73] Assignees: Hitachi, Ltd.; The Tokyo Electric Power Co., Inc., both of Tokyo, Japan

[21] Appl. No.: 667,330

[22] Filed: Mar. 11, 1991

[30] Foreign Application Priority Data

Mar. 9, 1990 [JP] Japan .................................. 2-59005

[51] Int. Cl.⁵ .............................................. G01D 5/34
[52] U.S. Cl. .................................. 250/231.1; 324/96
[58] Field of Search ........................ 250/231.1; 324/96

[56] References Cited

U.S. PATENT DOCUMENTS

| 3,662,263 | 5/1972 | Bengel | 250/231.1 |
| 4,446,425 | 5/1984 | Valdmanis | 324/77 K |
| 4,570,064 | 2/1986 | Nagatsuma et al. | 250/231.1 |
| 4,631,402 | 12/1986 | Nagatsuma et al. | 250/231.1 |
| 4,683,420 | 7/1987 | Goutzoulis | 324/96 |
| 4,968,881 | 11/1990 | Takahashi et al. | 250/231.1 |
| 4,975,635 | 12/1990 | Takahashi et al. | 324/96 |

FOREIGN PATENT DOCUMENTS

| 59-17170 | 1/1984 | Japan . |
| 59-116555 | 7/1984 | Japan . |
| 62-29263 | 2/1987 | Japan . |
| 63-29263 | 2/1988 | Japan . |
| 1-123162 | 5/1989 | Japan . |

Primary Examiner—Bruce C. Anderson
Attorney, Agent, or Firm—Antonelli, Terry, Stout & Kraus

[57] ABSTRACT

An optical d.c. voltage transformer having an electrooptic medium to which a d.c. electrical field or voltage to be measured is to be applied. The electrooptic medium affects the polarized light from the polarizer by an electrooptical effect to a degree proportional to the strength of the electrical field or voltage. The transformer includes a photodetector for producing an optical signal proportional to the affected light received from the electrooptic medium, a device for converting the optical signal from the photodetector into an electrical signal, a chopper for pulsating the electrical field or voltage to be applied to the electrooptic medium, in terms of time, a detector for demodulating the electrical signal from the converting device in synchronism with the pulsated electrical field or voltage, and an output unit for visually presenting the demodulated electrical signal similar in polarity to the electrical field or voltage to be measured.

20 Claims, 16 Drawing Sheets

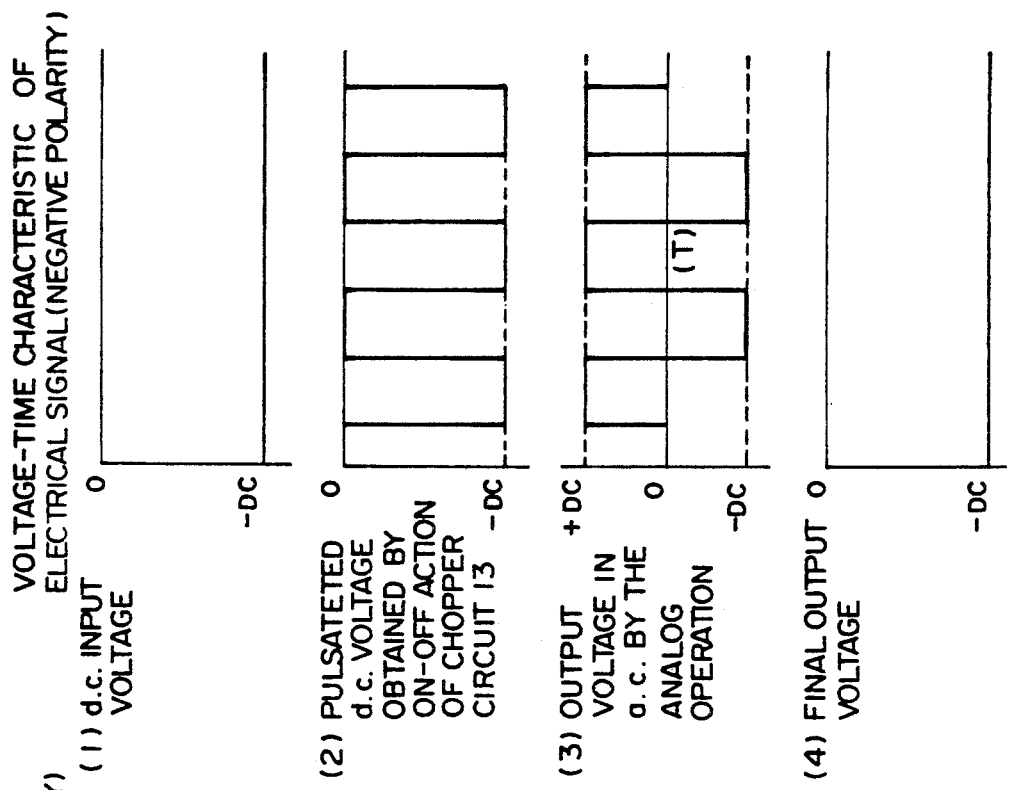
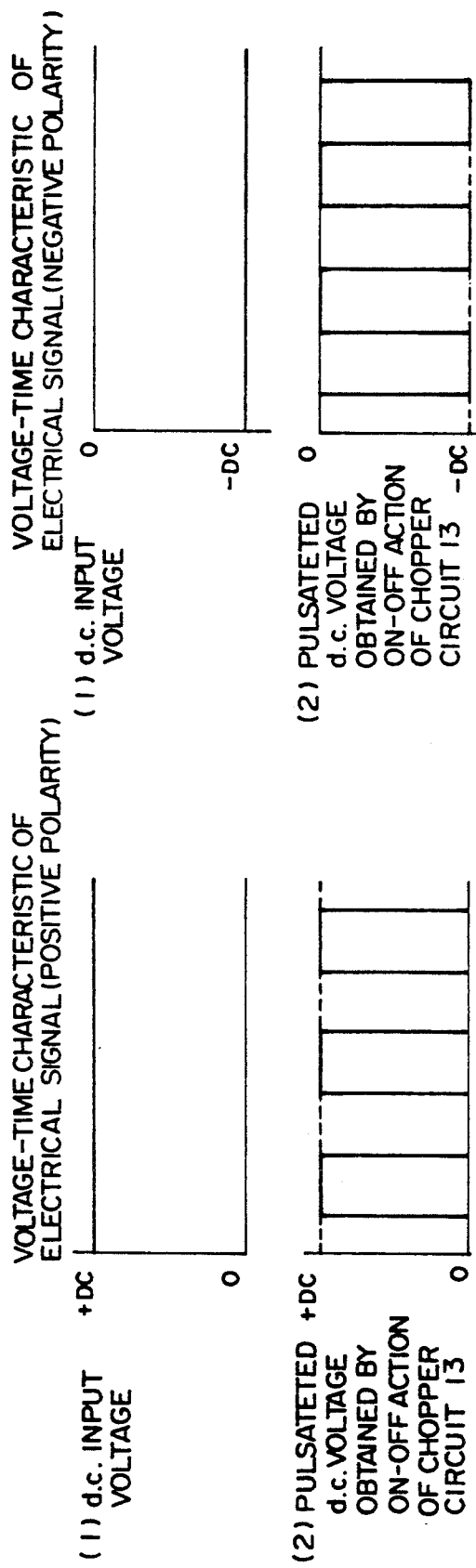

OPTICAL D.C. VOLTAGE TRANSFORMER

BACKGROUND OF THE INVENTION

1. Field of the invention

This invention relates to an optical transformer and more particularly to an optical d.c. voltage transformer which is suitable for preventing a d.c. drift by using both a chopper circuit and a synchronous detector circuit in detecting a d.c. voltage to be measured and also suitable for detecting an output voltage having the same polarity as the d.c. voltage to be measured.

2. Description of the Related Art

The conventional optical voltage measuring apparatus is exemplified by an optical voltage sensor shown in FIG. 8 of the accompanying drawings, generally designated by the numeral 3. The voltage sensor 3 comprises a luminous source 1, a first optical-fiber cable 2, a lens 27, a polarizer 4, a quarter-wave plate 5, an electrooptic medium (hereinafter also called "Pockels cell") such as BGO, a photodetector 7, second and third optical-fiber cables 8, 9, optical/electrical converter circuits 10, 11, and an operation circuit 12.

In operation, constant-intensity light emitted from the luminous source 1 is incident on the first optical-fiber cable 2 and is thereby guided to the sensor 3. As it passes through the sensor 3, the light is modified into parallel light by the lens 27, then into linearly polarized light by the polarizer 4, and further into circularly polarized light by the quarter-wave plate 5, whereupon the light reaches the Pockels cell 6. When a d.c. voltage to be measured is applied to the Pockels cell 6, an anisotropy (composite refraction change) proportional to the applied voltage is produced in the refractive index in the direction of the main axis. Namely, the circularly polarized light receives on the emitting end of the Pockels cell 6 the phase difference expressed by the equation:

$$\Gamma = \frac{2\pi l}{\lambda d} n_0 \gamma_{41} V_0 \sin\omega t \quad (1)$$

where l: the length of Pockels light path, d: the crystal thickness in a voltage applying direction, $\lambda$: a wavelength, $n_0$: the refractive index of Pockels cell with no voltage applied, $\gamma_{41}$: a Pockels factor, $V_0$: the amplitude of voltage applied, and $\omega$: the angular frequency of voltage applied.

By the phase difference of the equation (1), the circularly polarized light is modified into elliptically polarized light. This elliptically polarized light is divided into two mutually orthotropic signal components by a photodetector orthotropic to the polarizer and is converted into two optical signals of different light intensities proportional to the long axis and the short axis. Assuming that the outputs of the two intensity-modulated emitting lights after passing through the respective optical/electrical converter circuits 10, 11 are V.MDSD/1.MDNM/, V.MDSD/2.MDNM/, partial light that reaches the polarizer 4 via the lens 27, namely, incident light is I0, and ratio constants are k1, k2, the following equations (2) and (3) are obtained:

$$V1 = k1 I0 (1 + \sin\Gamma) \quad (2)$$

$$V2 = k2 I0 (1 + \sin\Gamma) \quad (3)$$

Now assuming that k1=k2 as adjustments are made in some way, the following equation also is obtained:

$$V = \frac{V1 - V2}{V1 + V2} = \sin 2\Gamma \quad (4)$$

In the range in which $\sin 2\Gamma << 1$, $\sin 2\Gamma$ is nearly equal to $2\Gamma$ so that an output proportional to the phase angle, i.e., an output V proportional to the voltage to be measured can be obtained from the operation circuit 12.

In this detection method, since the equation (4) is used, a value to be measured, even a d.c. voltage, can be detected by chopping, without being influenced by the amount of the incident light I0.

In general, however, in the light transmission system comprising the luminous source 1, the second and third optical-fiber cables 8, 9, the polarizer 4, the quarter-wave plate 5, the pockels cell 6 having electrodes to which voltage to be measured is to be applied, the photodetector 7, the optical/electrical converter circuits 10, 11 and the operation circuit 12, the transmission characteristic of the light amount is changed such as due to the temperature characteristic and the variation with elapse of time. Namely, a d.c. drift phenomenon occurs so that the state assuming k1=k2 is difficult to obtain. If k1≠k2, then the error V1−V2 in the equation (4) will increase sharply so that the error will become large in detecting a d.c. voltage.

For the measurement of a d.c. current, it is converted into a d.c. voltage, and then the d.c. voltage is measured. In this measurement, like the foregoing measurement, since the equation (4) is used, the same disadvantage is obtained.

In addition, the conventional d.c. voltage measurement encounters with the following problems.

Currently ferroelectric crystals such as BGO and LiNbO3 crystals are widely used as Pockels cells. Ferroelectric crystals have been regarded as having an optical linearity to an a.c. voltage so that an output having a modulated light intensity proportional to a voltage to be measured. In the case of d.c. voltage, however, when a Pockels cell composed of, for example, BGO or LiNbO3 is placed in a d.c. electric field or voltage, a ferroelectric crystal's own charging phenomenon occurs. The light output is lowered gently such as due to the charge to the cell surface and the movement of space charges within the Pockels cell so that the measurement will be impossible.

Attempts have been made to improve this prior problem as disclosed in, for example, Japanese Patent Laid-Open Publications Nos. 17170/1984, 116555/1984, 29263/1987 and 123162/1989.

Specifically, Japanese Patent Laid-Open Publication No. 17170/1984 shows a method for detecting a d.c. voltage during no light is irradiated from an another luminous source for photoconductive material, utilizing the change of a specific resistance of a photoconductive material between when the photoconductive material is subjected to irradiatation of light and when the photoconductive material is subjected to no irradiation of light. The photoconductive material to be irradiated by light is composed of CdS, CdSe or PdS, and is disposed between the electrodes to which the d.c. voltage to be measured is to be applied.

In this method of the Japanese publication 17170/1984, in order to prevent the light output from being gradually lowered with time under the influence by the electric charge, the resistance between the electrodes to which the d.c. voltage is to be applied is reduced to about $10^4$ $\Omega$cm by light irradiation, thereby releasing electric charge in the Pockels cell. However, the response time to the change of a d.c. voltage to be measure is long, and therefore, this prior method is not suitable for instrumentation and protection of substation facilities.

According to the technology disclosed in Japanese Patent Laid-Open Publication No. 116555/1984, there is provided second electrodes in order that electrical charge is short-circuited, and a rotary switch located between the second electrodes. When the rotary switch is in the on position, the electrodes, to which the d.c. voltage to be measured is to be applied, are short-circuited by the second electrodes to release electrical charge in the Pockels cell. Then the rotary switch is turned to the off position, whereupon measurement of a d.c. voltage takes place. Although it can be carried out with a simple basic construction, this method also is not suitable for the circuit that requires a transient response speed.

Japanese Laid-Open Publication No. 29263/1988 discloses a concept of measuring an electrostatic field, in the same manner as the case of an a.c. electric field, by pulsating the electrostatic field by a chopper in the form of a slitted rotary blade, which is grounded, without rotating the Pockels cell. However, this method also is not suitable for the circuit that requires a transient response speed.

In each of the foregoing chopper methods, any influence by space charge developed in the Pockels cell can be eliminated, but the response time is long and besides the output voltage is detected in terms of a.c. signal.

According to the technology disclosed in Japanese Patent Laid-Open Publication No. 123162/1989, as shown in FIG. 11 of the accompanying drawings, while CW (continuous-wave) light from a d.c. luminous source 170 is transmitted through a light modulator 140 including a polarizer 55, an electrooptics crystal 54, a phase compensator 56, and a photodetector 57, a voltage from an object 163 to be measured is applied to the light modulator 140 after being pulsated by a chopper circuit 10. The light having an intensity modulated by the pulsated voltage is sent to a sampling high-speed light detector 111 where the light is sampled as digital signal components while d.c. components are removed by a variable band-pass filter built in a lock-in amplifier 15. As a result, high-speed a.c. signal components are detected. The voltage from the object 163 to be measured is applied as a trigger signal to the sampling high-speed light detector 111 via a branch circuit 112, trigger signal generator 113, and delay circuit 14.

U.S. Pat. No. 4,446,425 to Valdmanis et al., as reillustrated here in FIG. 12, while light emitted from a pulsed luminous source 150 is transmitted through a light modulator 140 including a polarizer 55, an electrooptics crystal 54, a phase compensator 56, and a photodetector 57, a voltage from an object 53 to be measured is applied to the light detector 140 after being pulsated by a chopper 51 and a variable delay circuit 52. The light having an intensity modulated by the pulsated voltage is divided into two components by the analyzer 57. Then the two light components are sent to photo detectors 58, 59, respectively, and the d.c. component of the same phase is eliminated by a differential amplifier 60, whereupon the a.c. signal is sent to the lock-in amplifier 61 and then to an averager 62 to obtain an averaged output, which is displayed on a display 63. A lock-in amplifier 61 is operated by the output from the chopper 51 in synchronism with the chopper frequency.

The foregoing arrangements are similar to the present invention in some points and is different therefrom in the object of invention. These prior apparatuses are those for only obtaining the result of voltage detection and does not obtain polarity of voltage, retaining neither the function to protect machines except this apparatus nor the function as a control apparatus.

As a significant feature, the apparatus of the Japanese publication 123162/1989 calls for a sampling high-speed light detector 111. In this apparatus, only half-frequency signals are sampled by the sampling high-speed light detector 111 and by means of gate pulse. Therefore, even if the signal from the object to be measured is d.c., the polarity of the output of the differential amplifier 60 is not identical with that of the voltage passed through the lock-in amplifier 61 so that only positive signals are detected.

In the apparatus of the Valdmanis et al. U.S. Patent of FIG. 12, since the outputs from the photodetectors 58, 59 of the light modulator 140 are expressed by the equations (7) and (8) (described below) and are processed by the differential method, compensation takes place by releasing only the d.c. drift components. However, this U.S. Patent is totally silent about the concept of detecting a d.c. voltage corresponding to the polarity of a d.c. voltage to be measured.

In a substation, the polarity of a d.c. voltage is normally positive, but occasionally becomes negative by accident. Upon such an accident, measures must be taken after detecting the negative polarity; for this purpose, it is currently hoped that a transformer capable of measuring the polarity should be realized.

Consequently, each of the foregoing prior technologies is unsatisfactory for use in an optical d.c. voltage measuring apparatus in which a d.c. voltage to be measured is to be processed for instrumentation and protection of substation facilities and in which a d.c. output signal corresponding to the object d.c. voltage and having a polarity similar thereto is to be measured with the degree of precision within the reference JEC-1201 (on transformers for meters such as protective relays) according to the standards of Electrical Technical Committee, the Institute of Electrical Engineers of Japan.

SUMMARY OF THE INVENTION

It is therefore a object of this invention to provide an optical d.c. voltage transformer in which a d.c. output voltage corresponding to a d.c. voltage to be measured and having a polarity similar thereto can be obtained with good precision by pulsating the object d.c. voltage so as to treat the pulsated d.c. voltage as an a.c. voltage, by performing an operation process of the object d.c. voltage, and by demodulating the pulsated signal in synchronism with the operation-processed signal.

According to the invention, there is provided an optical d.c. voltage transformer which includes a luminous source for outputting a constant d.c. level of light; a polarizer for polarizing the light received from the luminous source; an electrooptic medium to which a d.c. electrical field or voltage to be measured is to be applied, the electrooptic medium being adapted for affecting the polarized light from the polarizer by an electrooptical effect to a degree proportional to the strength of the electrical field or voltage; a photodetector for producing an optical signal proportional to the affected light received from the electrooptic medium; a device for converting the optical signal from the photodetector into an electrical signal; a chopper for pulsating the electrical field or voltage, which is to be applied to the electrooptic medium, in terms of time; a detector for demodulating the electrical signal from the converting device in synchronism with the pulsated electrical field or voltage; and an output unit for presenting the demodulated electrical signal similar in polarity to the electrical field or voltage to be measured.

In other words, an output signal devoid of d.c. drift portions is obtained by pulsating a d.c. voltage to be measured and to be applied to the Pockels cell by the electrical chopping and then performing the same signal processing as that for the measurement of an a.c. voltage. And the polarity of the d.c. voltage is detected by demodulating the signal, which is synchronous with the chopping frequency, by a synchronizing detector circuit.

In operation, the signals of the same frequency are sent respectively to the chopper circuit and the synchronizing detector circuit by an oscillator. In the chopper circuit, closing and opening operation, i.e., an on-off action is repeated at the described frequency by the electronic switching such as by a transistor so that both positive and negative d.c. voltages in a wide range can be measured with improved precision. For this purpose, a positive or negative square-wave signal is applied to the Pockels cell.

At that time, if only an a.c. component of the square-wave signal is treated as an object to be measured, the incident light becomes intensity-modulated light having the above-described switching frequency as passed through the Pockels cell and the photodetector. This intensity-modulated light is introduced to the optical-/electrical converter circuit.

Now the mutually orthoropic output lights $V_1$, $V_2$ are given in the following equations:

$$V1 = k1I0(1 + m \cdot \sin \omega t) \tag{5}$$

$$V2 = k2I0(1 - m \cdot \sin \omega t) \tag{6}$$

where $I0$ is the intensity of the incident light, m is a modulation factor, and $\omega$ is the angular frequency of the applied voltage. The modulation factor m for that time is given as follows:

$$m = \frac{2\pi ln0^3 \gamma 41 V0}{\lambda d} \tag{7}$$

In the signal processing circuit, an arithmetic operation given by the equation (8) below electrically takes place on the equations (5) and (6) to obtain an output voltage Vout as follows:

$$V_{out} = K \left( \frac{V1 - \overline{V1}}{\overline{V1}} - \frac{V2 - \overline{V2}}{\overline{V2}} \right) \tag{8}$$

where K is the ratio constant of the signal processing circuit, and $\overline{V1}$, $\overline{V2}$ are the average values of the respective output lights V1, V2.

Since the d.c. drift portions (included in I0 of the equations (5) and (6)) are completely released from the output voltage Vout by adopting the equation (8), there will be no influence by the d.c. draft portions.

Since this output Vout is an a.c. signal, it is possible to identify the polarity of the a.c. voltage to be measured.

Now assuming that the equations (5) and (6) are substituted for the equation (8), then Vout yields as follows:

$$V_{out} = 2K \cdot m \cdot \sin \omega t \tag{9}$$

It is noted from the equation (9) that if the voltage to be measured is positive, Vout is positive when the chopper is in the ON state. If the voltage to be measured is negative, Vout is negative when the chopper is in the ON state.

In order to identify the polarity of Vout obtained from the equation (9), the pulsated signal is taken from the chopper circuit and is then introduced to the synchronizing detector circuit. In this synchronizing detector circuit, the output signal Vout is synchronous with the pulsated signal of the chopper circuit. Therefore, if the d.c. voltage to be measured is positive, only the positive signal ½ Vout of the equation (9) is selected so that it will be outputted as a positive d.c. voltage in the susequent smoothing circuit.

On the contrary, as a matter of fact, if the d.c. voltage to be measure is negative, a negative d.c. voltage will be outputted by the same process as the foregoing.

The above and other advantages, features and additional objects of this invention will be manifest to those versed in the art upon making reference to the following detailed description and the accompanying drawings in which several preferred embodiments incorporating the principles of this invention are shown by way of illustrative examples.

BRIEF DESCRIPTION OF THE DRAWINGS

FIGS. 3(a) and 3(b) are graphs showing the voltage-time characteristic of an electrical signal in each part or element of the transformer of the first embodiment;

DETAILED DESCRIPTION

Figure 1:
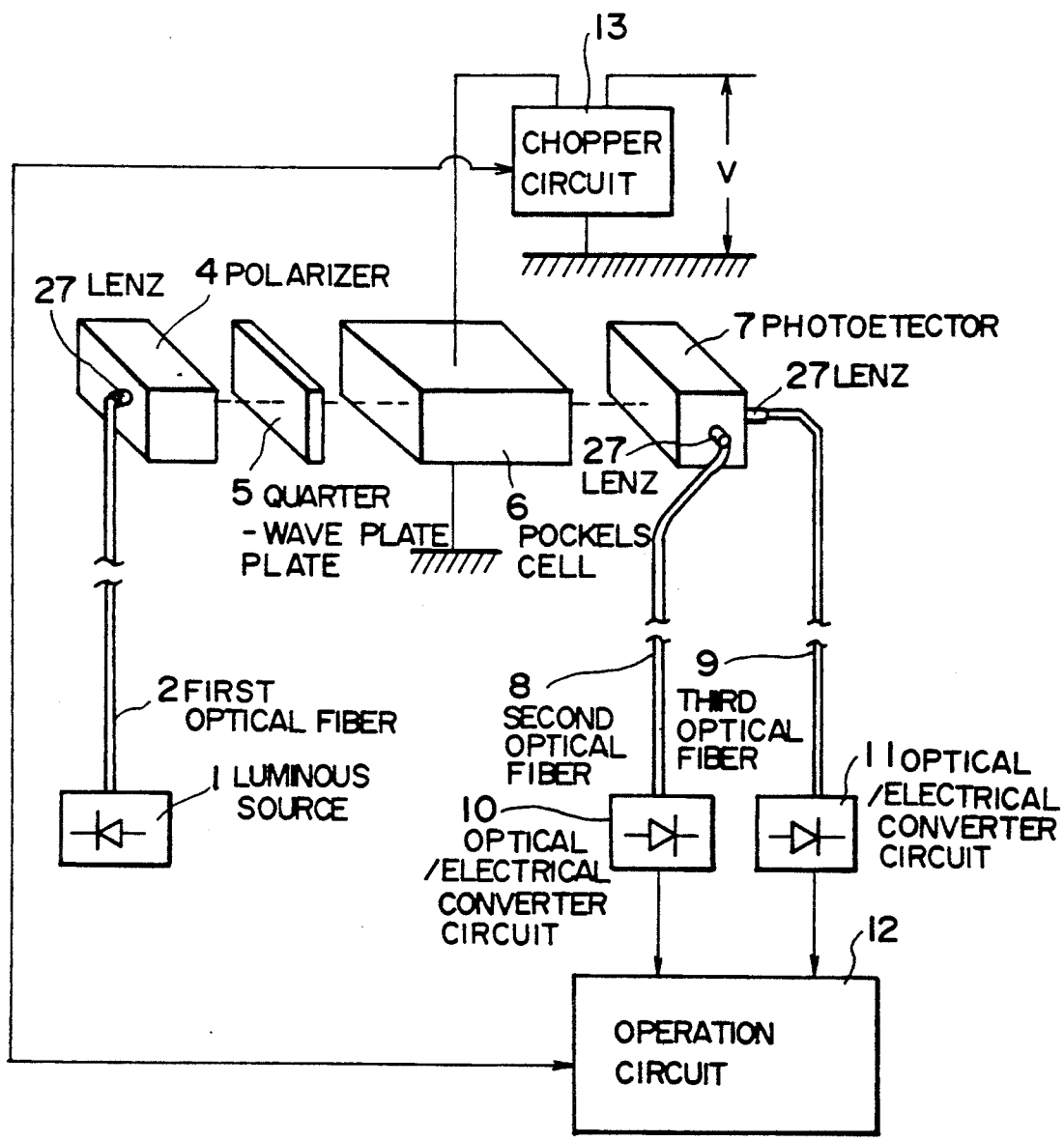
FIG. 1 is a diagram showing an optical d.c. voltage transformer according to a first embodiment of this invention.
Figure 2:
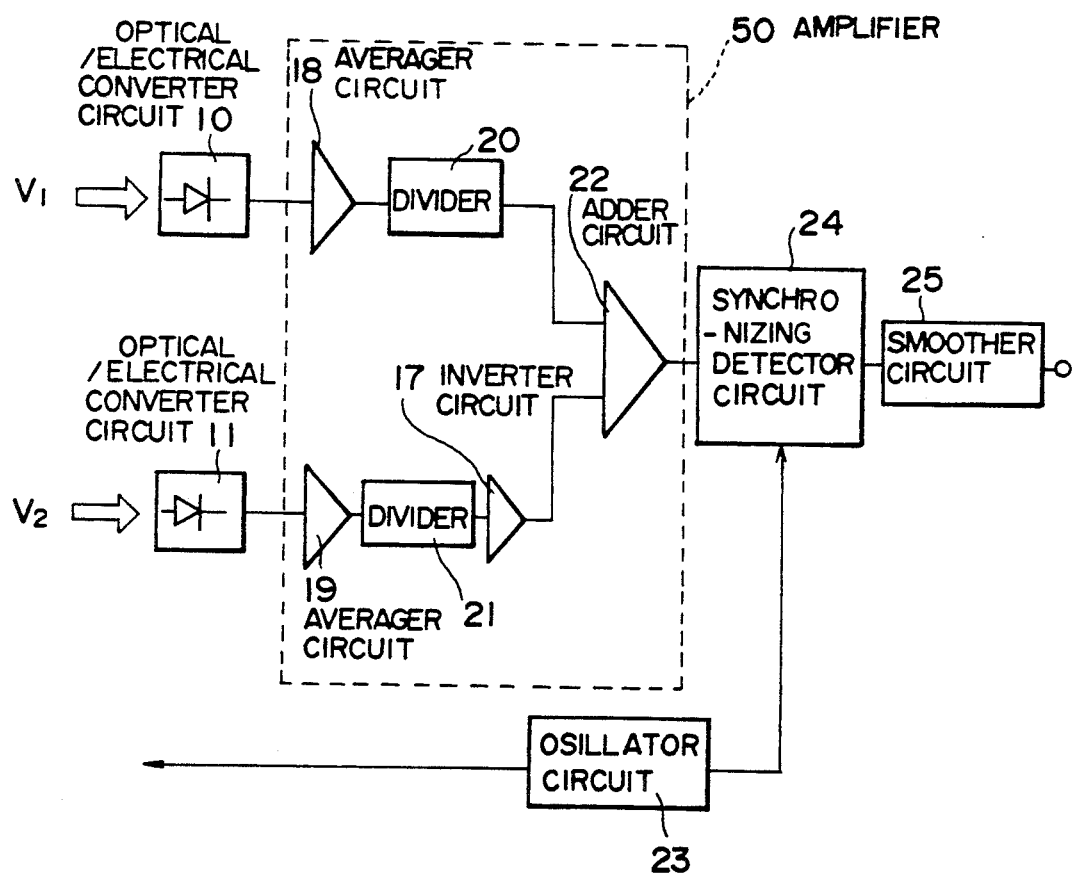
FIG. 2 is a diagram showing an operation circuit of the optical d.c. voltage transformer of FIG. 1.

The principles of this invention are particularly useful when embodied in an optical d.c. voltage transformer (hereinafter also called "transformer") such as shown in FIGS. 1 and 2.

As shown in FIG. 1, the transformer comprises a luminous source 1, a first optical-fiver cable 2, a lens 27, a polarizer 4, a quarter-wave plate 5, a Pockels cell 6, a photodetector 7, second and third optical-fiber cables 8, 9 for emitting light, optical/electrical converter circuits 10, 11, and operation circuit 12, and a chopper circuit 13. The details of the operation circuit 12 is described below in connection with FIG. 2.

The chopper circuit 13 pulsates an electrical field or voltage, which is to be applied to the Pockels cell 6, in terms of time, the Pockels cell 6 having an electrooptic characteristic.

In the luminous source 1, a constant-intensity of light is emitted such as by a luminous diode or a laser diode to enter the first optical-fiber cable 2. The light is then introduced to the polarizer 4 after passing the lens 27. At that time, linearly polarized light is modified to circularly polarized light by the quarter-wave plate 5, and the circularly polarized light enters the Pockels cell 6 such as of BGO.

A d.c. voltage V to be measured is pulsated by an electrical chopper circuit 13 composed of a semiconductor device such as a diode or an FET, and the pulsated voltage is applied to the Pockels cell 6. By this pulsated voltage, the circularly polarized light is changed to ecliptically polarized light, whereupon the ecliptically polarized light is divided into two mutually orthotropic components by the photodetector 7. These two light components of different directions are guided respectively to the optical/electrical converter circuits 10, 11 by the second and third optical-fiber cables 8, 9.

Then the output signals of the pulsated light are sent to the operation circuit 12 where the same signal processing as in the above-described measurement of a.c. voltage is performed on the output signals to eliminate all of the d.c. components, resulting in no influence by the d.c. drift.

Since the output signals are demodulated in synchronism with the chopper circuit 13, which pulsates the d.c. voltage, and are then smoothed, a signal of the same polarity as the object signal to be measured is outputted.

This signal processing of the operation circuit 12 will now be described in greater detail in connection with FIG. 2.

In FIG. 2, reference numerals 10, 11 designate optical/electrical converter circuits for converting the light signals V1, V2, which are received from the photodetector 7 (FIG. 1), into electrical signals; 18, 19, averager circuits for averaging each V1 and V2 to obtain $\overline{V1}$ and $\overline{V2}$, respectively; 20, a divider for dividing the difference between V1 and $\overline{V1}$ (V1−$\overline{V1}$) by $\overline{V1}$; 21, a divider for dividing the difference between V2 and $\overline{V2}$ (V2−$\overline{V2}$) by $\overline{V2}$; 17, an inverter circuit for reverses the polarity of the output of the divier 21; 22, an adder circuit for obtaining Vout of the equation (8) from the output of the divider circuit 20 and the inverter circuit 17.

An amplifier 50 is composed of the averager circuits 18, 19, the divider circuits 20, 21, the inverter circuit 17 and the adder circuit 22.

24 designates a synchronizing detector circuit for performing synchronizing and demodulating Vout by a timing signal (described below); 23, an oscillator circuit for transmitting the same timing signals to the chopper circuit 13 and the synchronizing detector circuit 24; and 25, a smoother circuit for smoothing the output of the synchronizing detector circuit 24 to produce a signal corresponding to the polarity of the voltage to be measured.

The light output, which is divided into two mutually orthotropic polarized components V1, V2 by the photodetector 7 located at the output end of the Pockels cell 6, are converted into electrical signals by the optical-/electrical converter circuits 10, 11, respectively. The electrical signals pass through the averager circuits 18, 18 of the amplifier 50 and the dividers 20, 21 (V2 component passes the inverter circuit 17), and then reach the adder circuit 22 where the arithmetic operation of the equation (8) is performed. Thus in this signal processing circuit, since every signal is processed as an a.c. signal, it is possible to almost completely eliminate the d.c. drift portions, which have been regarded as a problem when measuring a d.c. voltage in the conventional manner.

Figure 9:
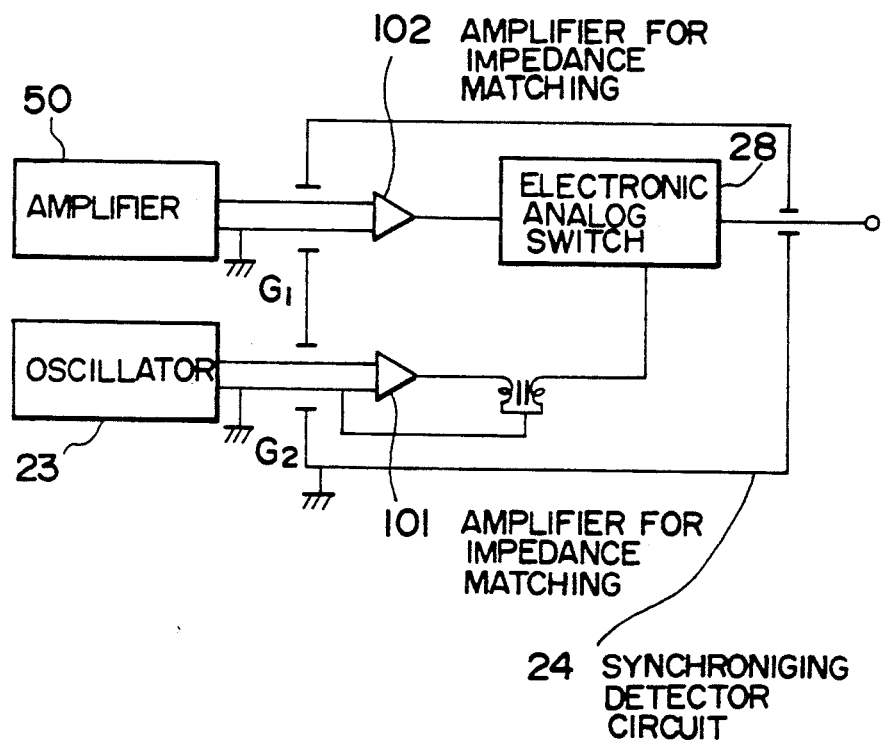
FIG. 9 is a circuit diagram showing a typical synchronous detector circuit.

In the case of this a.c. signal, the polarity of the d.c. voltage to be measured could not be discriminated in the prior art. To this end, this invention calls for the synchronizing detector circuit 24 which synchronizes the signals from the oscillator 23 with the a.c. output from the adder circuit 22. The synchronizing detector circuit 24, as shown in FIG. 9, equalizes the phase of the signal, as the reference signal, of the oscillator circuit 23, to the phase of the pulsated signal of the amplifier 50. Specifically, the output signal from the amplifier 50 passes the synchronizing detector circuit 24, which includes a selector circuit 28 (such as an electronic analog switch) for selecting the signal portions to be obtained as synchronized with the positive side or those to be obtained as synchronized with the minus side. The selected output signal is converted from an a.c. value to a d.c. value, thus obtaining the final d.c. output signal. At that time, in order that the positive and negative signal detection values have no error, the ground G1 of the pulsated signal line and the ground G2 of the reference signal line are mutually floating with respect to each other. The other blocks are insulated from one another by the optical-fiber cables. With this construction, the d.c. output voltage corresponding to the polarity of a d.c. voltage to be measured.

The voltage-time characteristics of electrical signals at various parts or elements will now been described in connection with FIGS. 3(a) and 3(b). In FIGS. 13(a) and 13(b), the graph (1) shows a characteristic of a d.c. input voltage to be measured; the graph (2), a characteristic of a pulsated d.c. voltage obtained by the on-off action of the chopper circuit 13; the graph (3), a characteristic of the output voltage processed in a.c. by the analog operation; and (4), a characteristic of the final output voltage obtained after passing the synchronizing detector circuit and the smoother circuit. Throughout the progressive process stages from (1) the d.c. input to (4) the d.c. output, the a.c. signal processing takes place so that the d.c. drift portions mixed with the signal being processed can be almost completely eliminated.

In this embodiment, the characteristic of the output of the chopper of FIG. 3(a) (2) shows the characteristic of only the positive polarity or only the negative polarity. Alternatively, the voltage may be pulsated for both the positive and negative electrodes by modifying the chopper circuit, thus realizing exactly the same operation and result as the foregoing.

Figure 4:
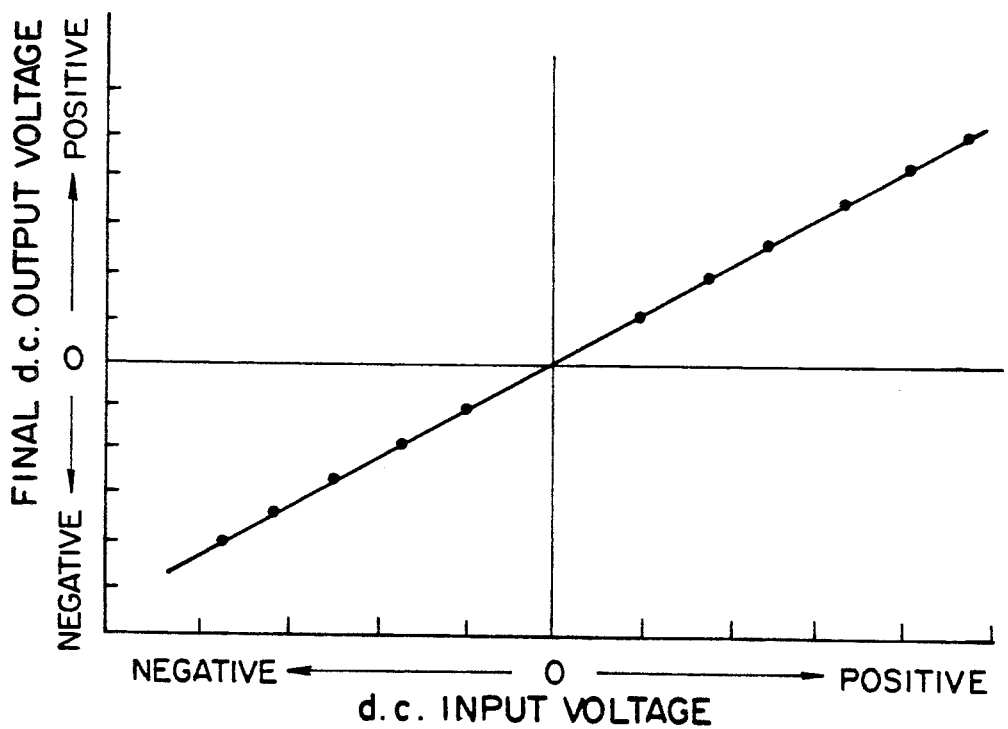
FIG. 4 is a graph showing the result of actual measurement of d.c. voltage according to this invention.

FIG. 4 shows the result of actual measurements of a d.c. voltage. There is an excellent linear relation between the input voltage and the signal-processed final d.c. output voltage throughout the positive and negative values. This invention realizes high-precision measurement of a d.c. voltage.

Figure 5:
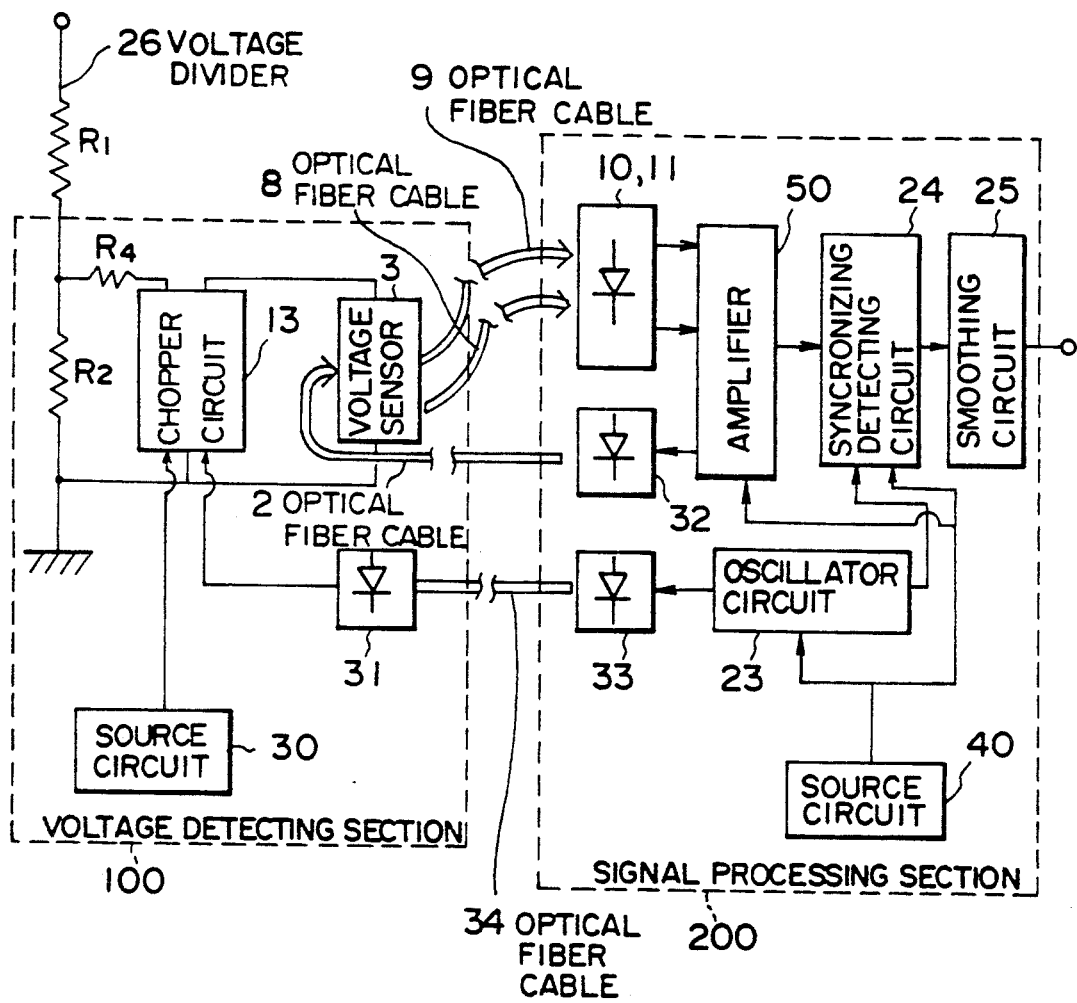
FIGS. 5, 6(a) and 6(b) are circuit diagrams showing various other embodiments.

FIG. 5 shows another embodiment of this invention, in which a practical measuring system is constructed based on the embodiment of FIG. 1 and is chiefly divided into two sections, i.e. a voltage detecting section 100 and a signal processing section 200.

In the voltage detecting section 100, a d.c. voltage to be measured is reduced by resistors R1, R2 by a voltage divider 26 so as to be set to a suitable value, and is inputted to the chopper circuit 13 via a protective resistor R4. This voltage detecting circuit 100 includes a source circuit 30 and an optical/electrical converter circuit 31 for driving the chopper circuit 13, and the voltage sensor 3. On the other hand, the signal processing section 200 includes the optical/electrical converter circuits 10, 11, 32, 33, the amplifier 50, the synchronizing detector circuit 24, the smoothing circuit 25, the oscillator circuit 23, and a power source circuit 40 for driving these parts or elements. The voltage detecting section 100 and the signal processing section 200 are joined with each other by the optical-fiber cables 2, 8, 9 and 34, and the power source for each part or element is independent. Since the voltage detecting section 100 and the signal processing section 200 can be electrically perfectly separated from each other, it is possible to realize a highly reliable measuring system which is noise-free and is less misoperation.

The principles and results of d.c. voltage measurement in this system are the same as those described in connection with the embodiment of FIGS. 1 through 4.

Figure 16:
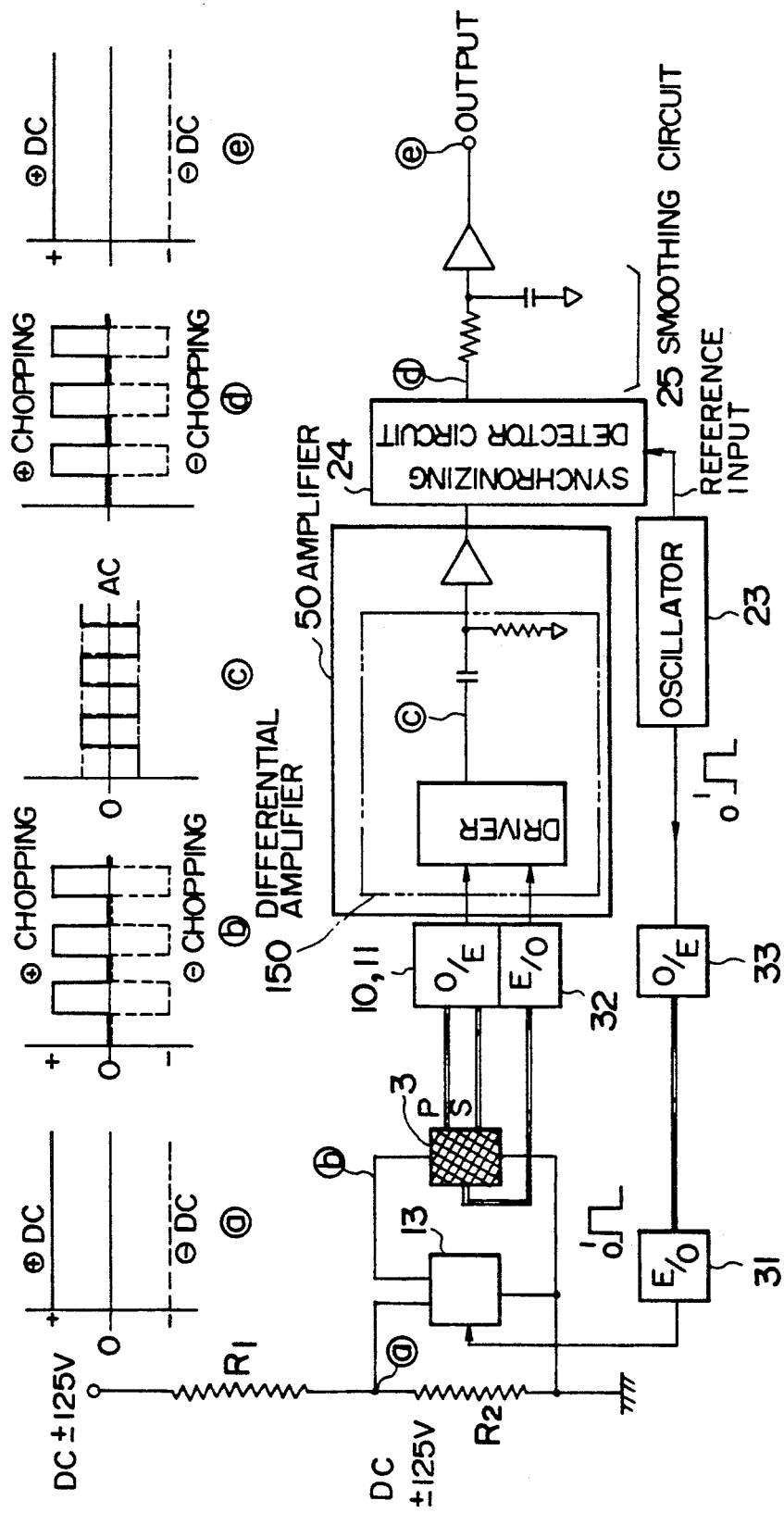
FIG. 16 shows a signal processing circuit and signal waveforms of various parts or elements of the optical d.c. voltage transformer of FIG. 5.

The signal processing circuit and the signal waveforms of various parts or elements of the transformer of FIG. 5 are shown in FIG. 16.

Figure 6A:
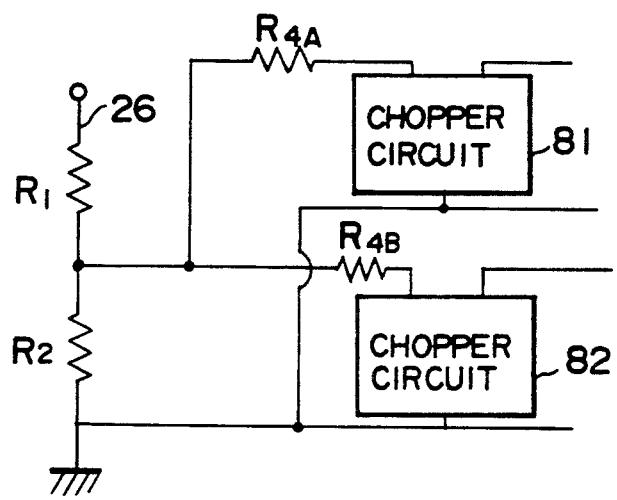
Figure 6B:
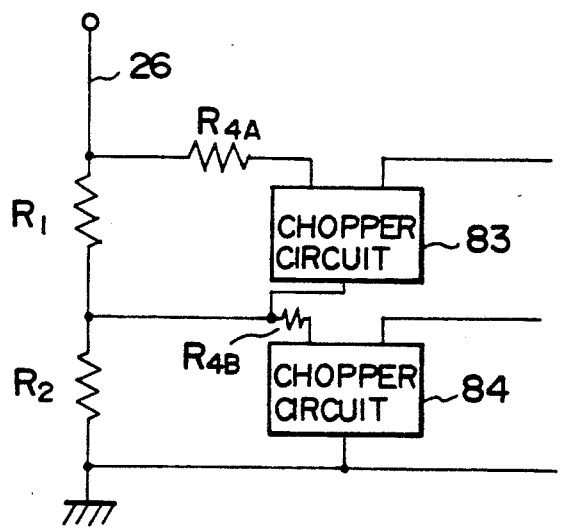

FIGS. 6(a) and 6(b) show still another embodiment in which a modified measuring system is constructed based on the principles of this invention.

This modified measuring system is a double form composed of two parallel systems each having the construction of FIG. 5. In FIG. 6(a), two measuring systems are parallel connected from one resistor R2 of the voltage divider 26 via the chopper circuits 81, 82. Separate resistors R4A, R4B which double as protectors serve only to protect the chopper circuits if the chopper circuits 81, 82 of the two systems are the synchronizing type. If the two chopper circuits 81, 82 are the non-synchronizing type, the separate resistors serve to prevent these chopper circuits from mutual interference. In FIG. 6(b), the chopper circuits 83, 84 are connected respectively to the resistors R1, R2 so that the two measuring systems are arranged in parallel.

Figure 10:
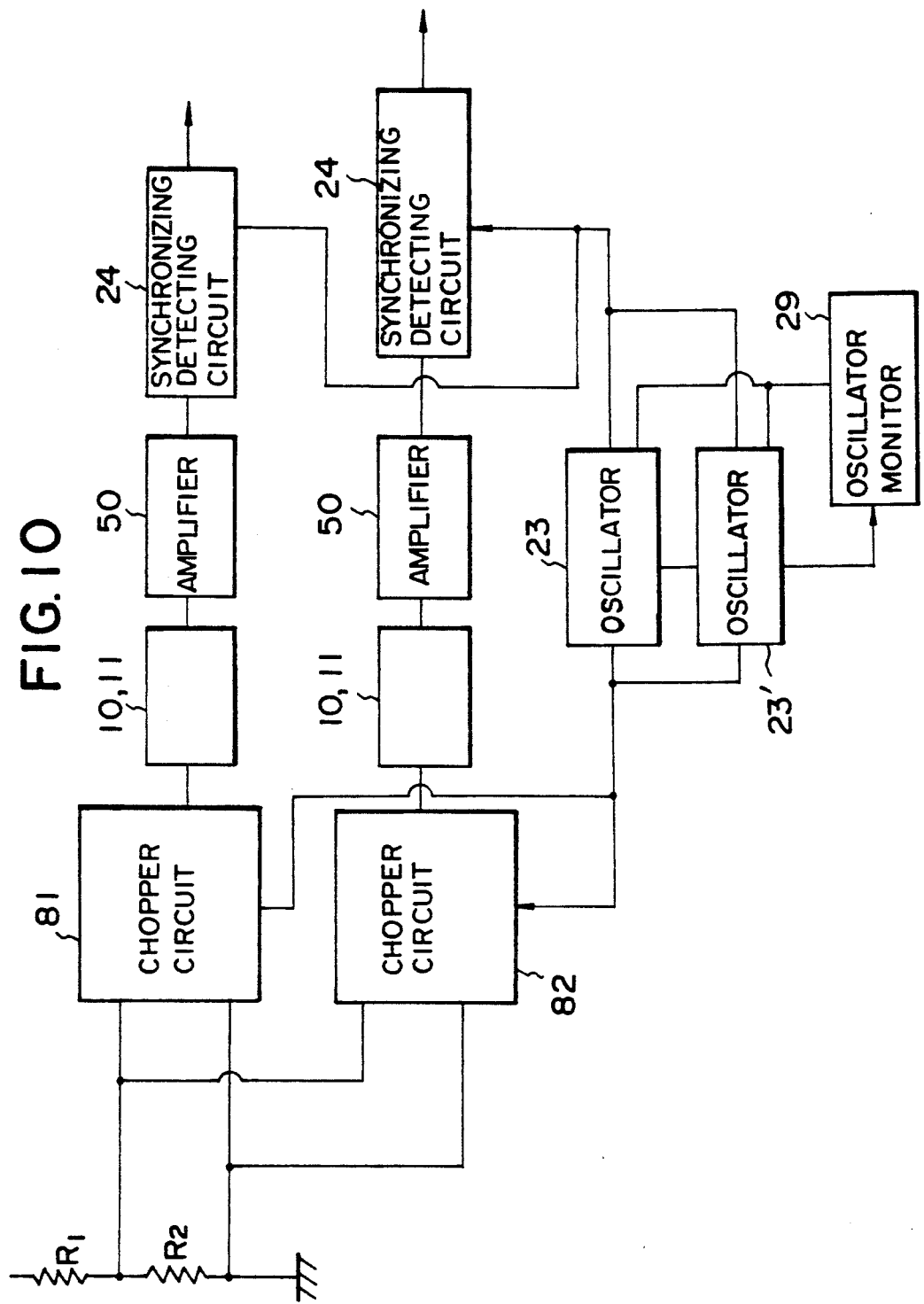
FIG. 10 is a circuit diagram showing a synchronized example of the chopper of FIG. 6.
Figure 11:
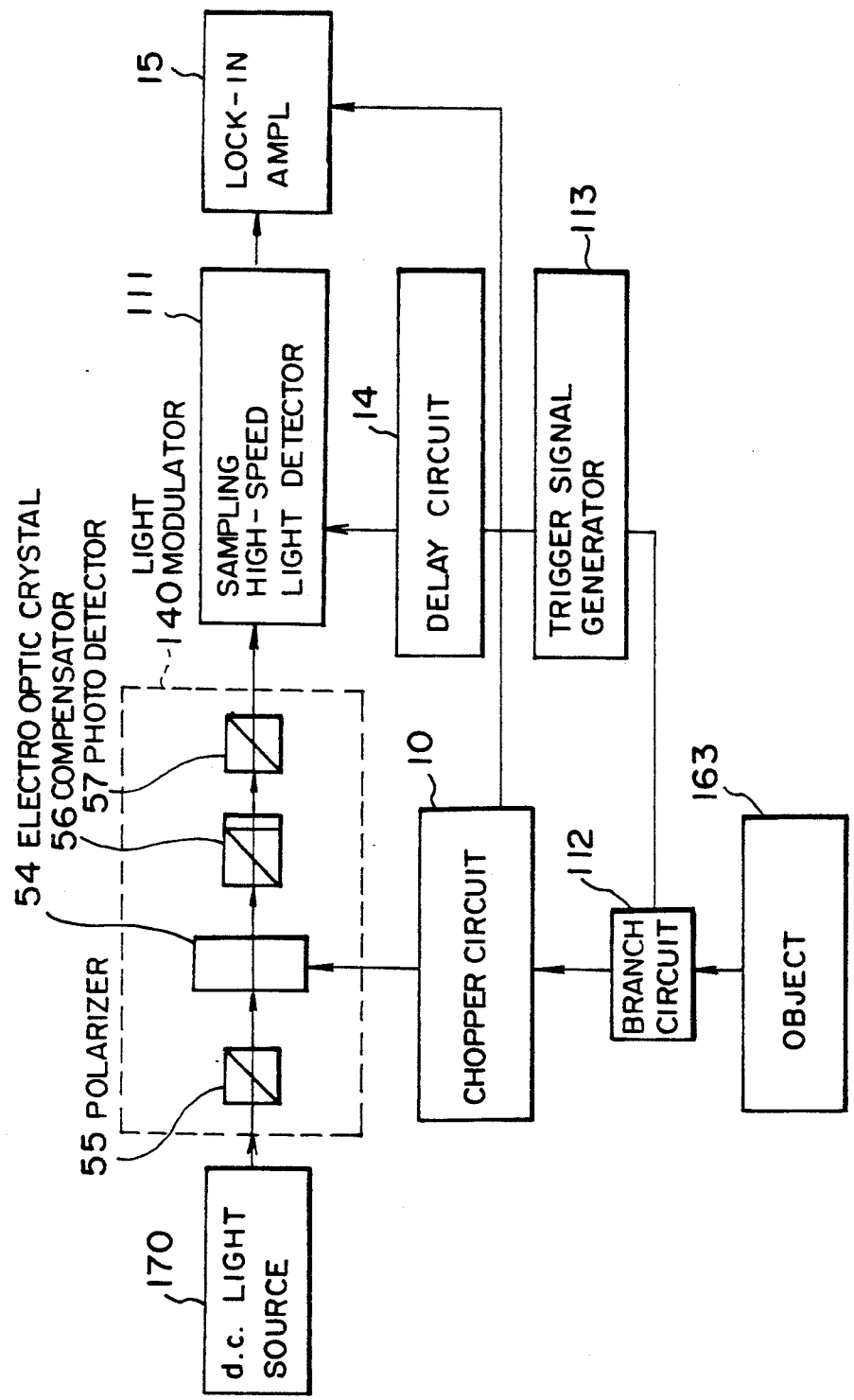
FIGS. 11 and 12 are block diagrams showing prior art optical d.c. voltage measuring instrument.
Figure 12:
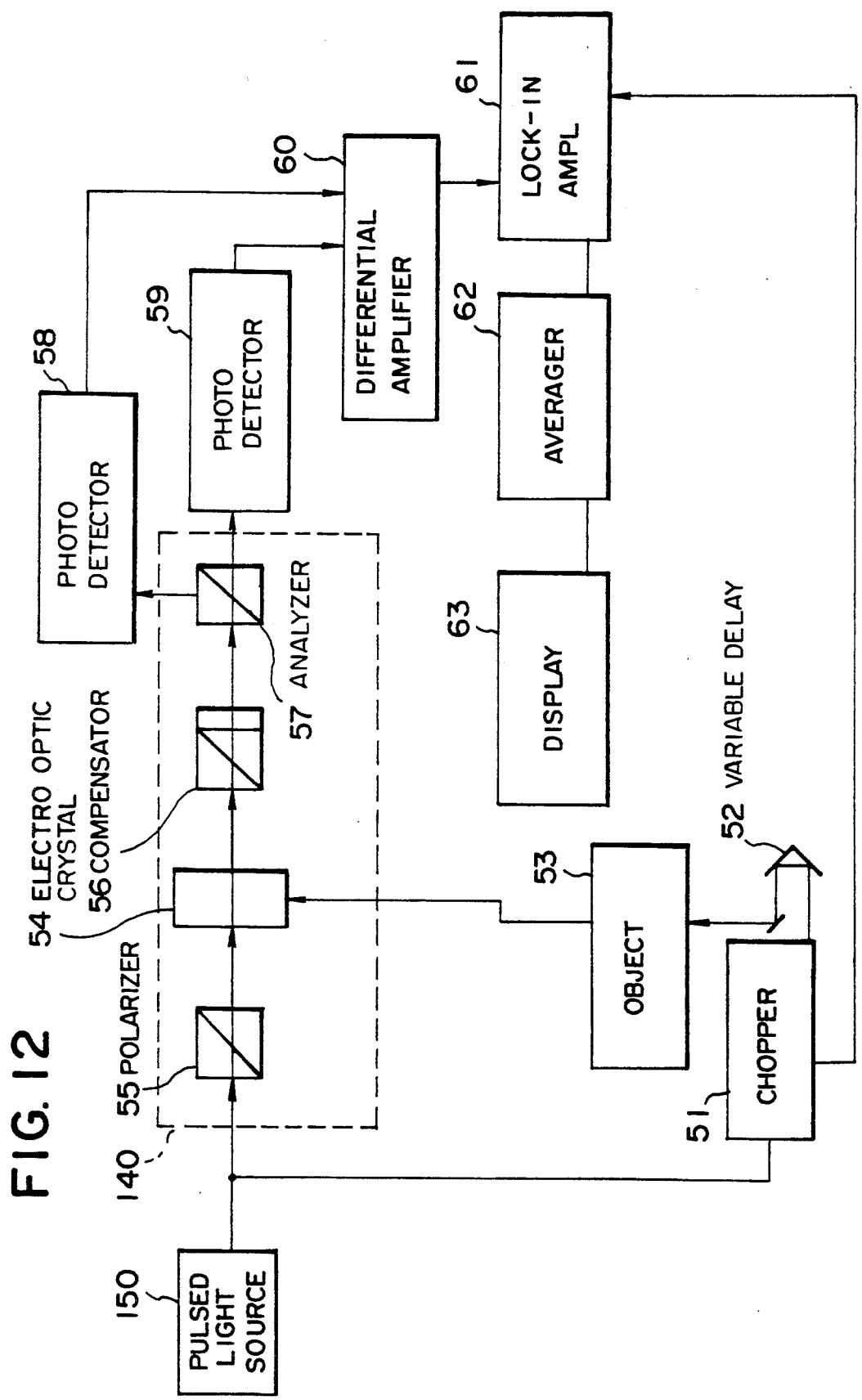

FIG. 10 shows a further embodiment which is similar to the construction and different therefrom in that the chopper circuits 81, 82 also are synchronized with each other. Two oscillators 23, 23' are monitored by an oscillator monitor 29; when any abnormality arises in one oscillator 23, then the other oscillator 23' will soon be activated. In an alternative way, the two oscillators 23, 23' may simultaneously operated, with only one oscillator normally kept generating an output signal; if such one oscillator becomes out of order, then the other oscillator will soon start generating a signal output.

Thus, by synchronization, it is possible to improve the operational precision of the chopper circuits.

Figure 7:
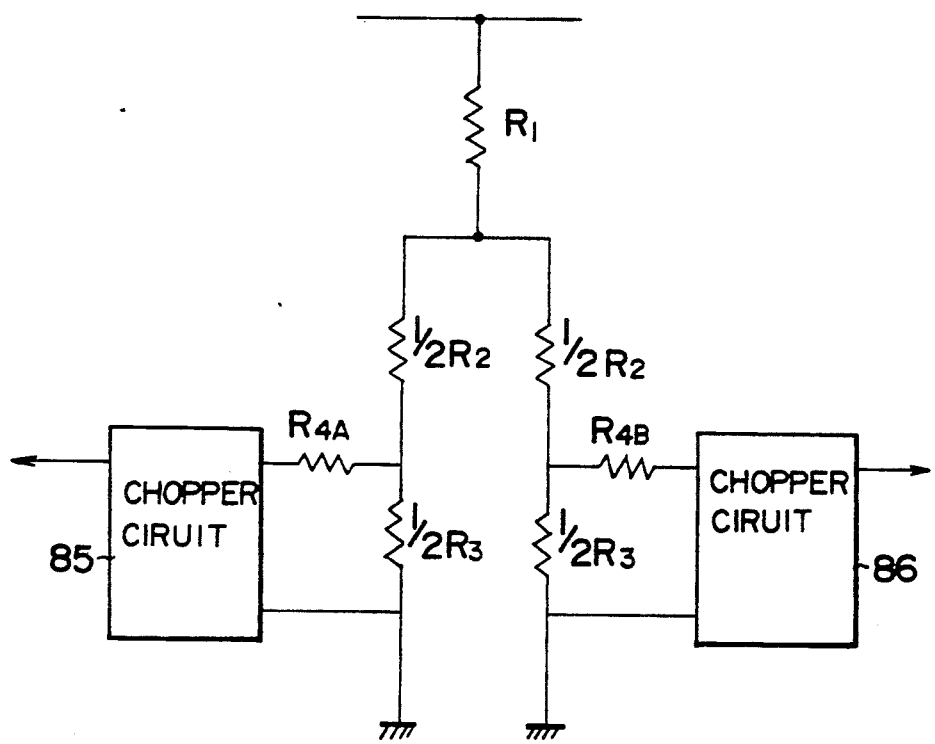
FIG. 7 is a circuit diagram showing a highly precised example of the chopper of FIG. 6.
Figure 8:
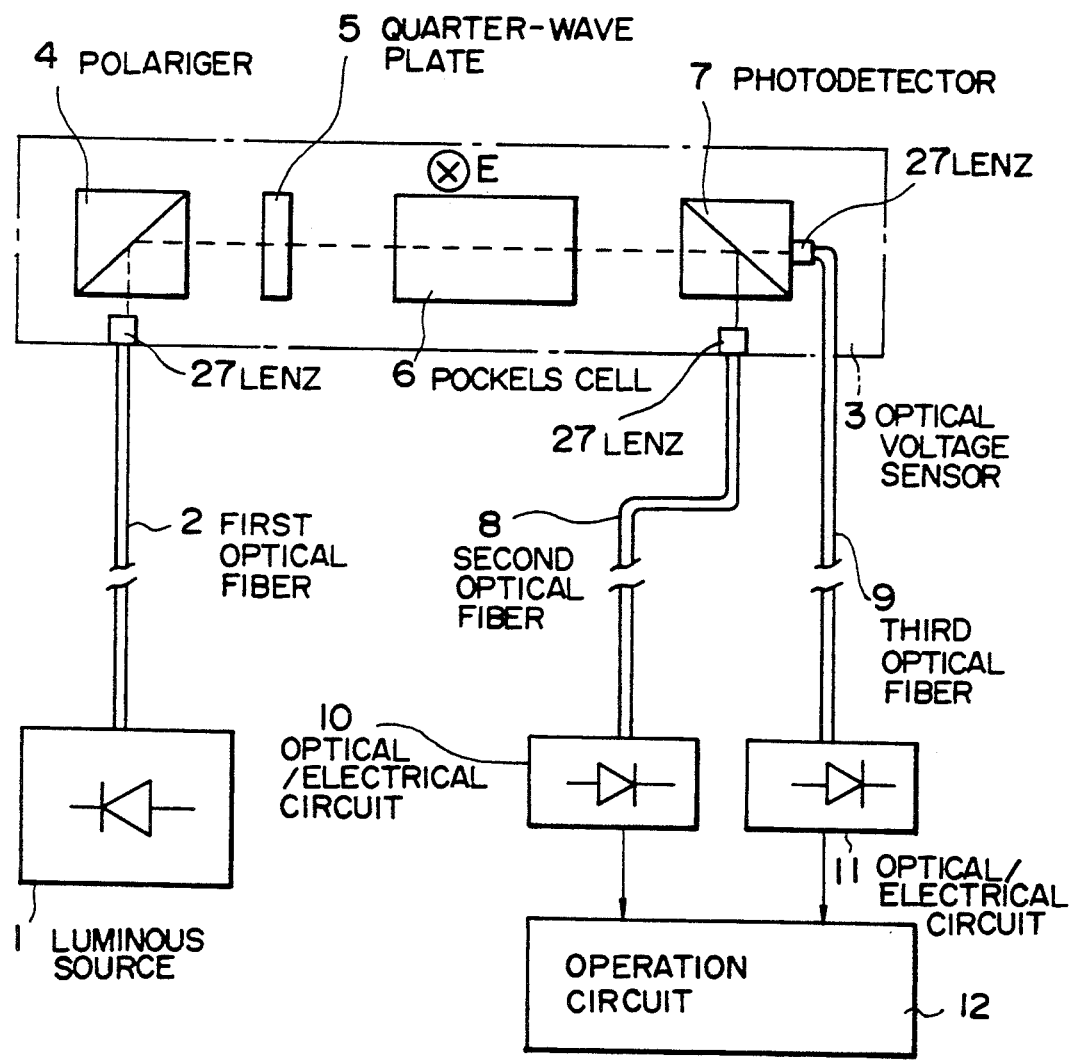
FIG. 8 is a diagram showing a prior art optical d.c. voltage transformer.

FIG. 7 shows a still further embodiment which offers an improved degree of precision for the two non-synchronizing chopper circuits, compared to those of FIG. 6.

In FIG. 6, the values of the separate resistors R4A, R4B must be set to values so as not to influence upon the response speed of the output signal V and the output voltage of the chopper circuit 13 in FIG. 5. Further, it is very difficult to set these values so as not to influence also upon the relation between the two chopper circuits. The example of FIG. 7 is to reduce these influences to a minimum. The voltage-dividing resistor R2 of the voltage divider 26 is divided into R2, R3, and these resistors R1, R2, R3 are arranged so as to satisfy the relation R1>R2>R3. A predetermined detection voltage is taken from R3. Since the voltage-dividing resistor R2 is located between the chopper circuits 85, 86, currents mutually flowing into the chopper circuits 85, 86 will be reduced so that the degree of mutual influence is minimized remarkably, thus facilitating the setting of R3.

Therefore the separate resistors R4A, R4B can be minimized to improve the degree of chopping precision.

The construction composed of plural systems makes the reliability of the measuring system surer so that monitoring, protecting and controlling by the measuring system can be realized much more reliably.

Figure 15:
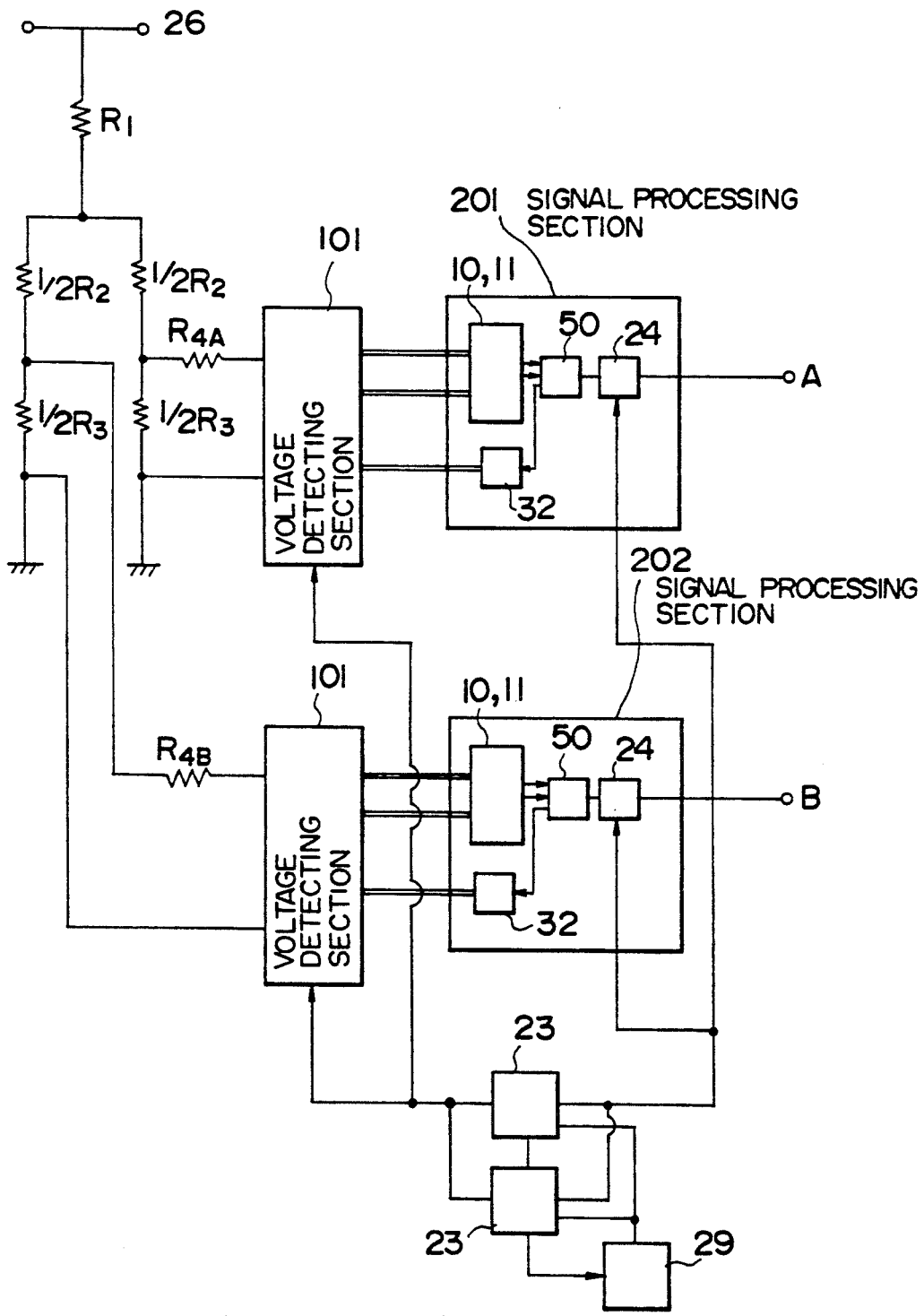
FIG. 15 is a circuit diagram showing a modified optical d.c. voltage transformer in which a common oscillator is used for a plurality of measuring routes.

FIG. 15 shows an example in which a common oscillator is used for a plurality of systems. For example, even if the number of chopper circuits is more than two, only two oscillators are needed.

The optical d.c. transformer of this embodiment comprises voltage detecting units 101, 102, signal processing units 201, 202, an oscillator circuit 23, and an oscillator circuit monitor 29. Each of the signal processing units 201, 202 includes an optical/electrical converter circuit 10, 11, 32, an amplifier 50, and a synchronizing detector circuit.

Figure 14:
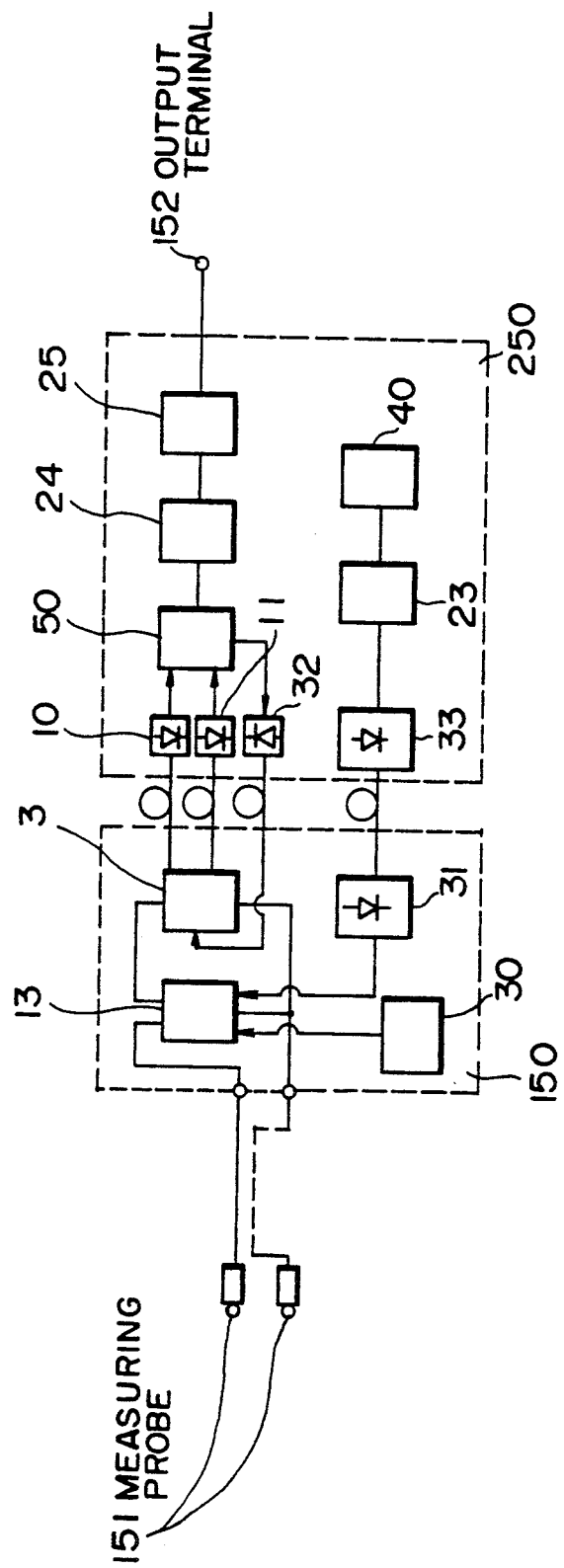
FIG. 14 is a circuit diagram showing a modified optical d.c. voltage measuring instrument of the invention.

FIG. 14 shows a typical optical d.c. measuring instrument which comprises a measuring probe 151, a voltage detecting section 150, a signal processing section 250, and an output terminal 152.

The voltage detecting section 150 includes a chopper circuit 13, a voltage sensor 3, an optical/electrical converter circuit 31, and a power circuit 30.

The signal processing section 250 includes an optical/electrical converter circuit 10, 11, 32, 33, an amplifier 50, a synchronizing detector circuit 24, a smoother circuit 25, an oscillator circuit 23, and a power circuit 40.

In this instrument, the input side is a terminal to be measure so that measuring is possible, irrespective of the shape of a d.c. voltage output terminal. In this structure, the measuring prove 151 and the voltage detecting section 150 may be reduced to a compact size, with the signal processing section 250 being located remotely therefrom.

The d.c. voltage transformer of this invention is suitable for measurement of a voltage, particularly a d.c. voltage such as of a substation.

Figure 13:
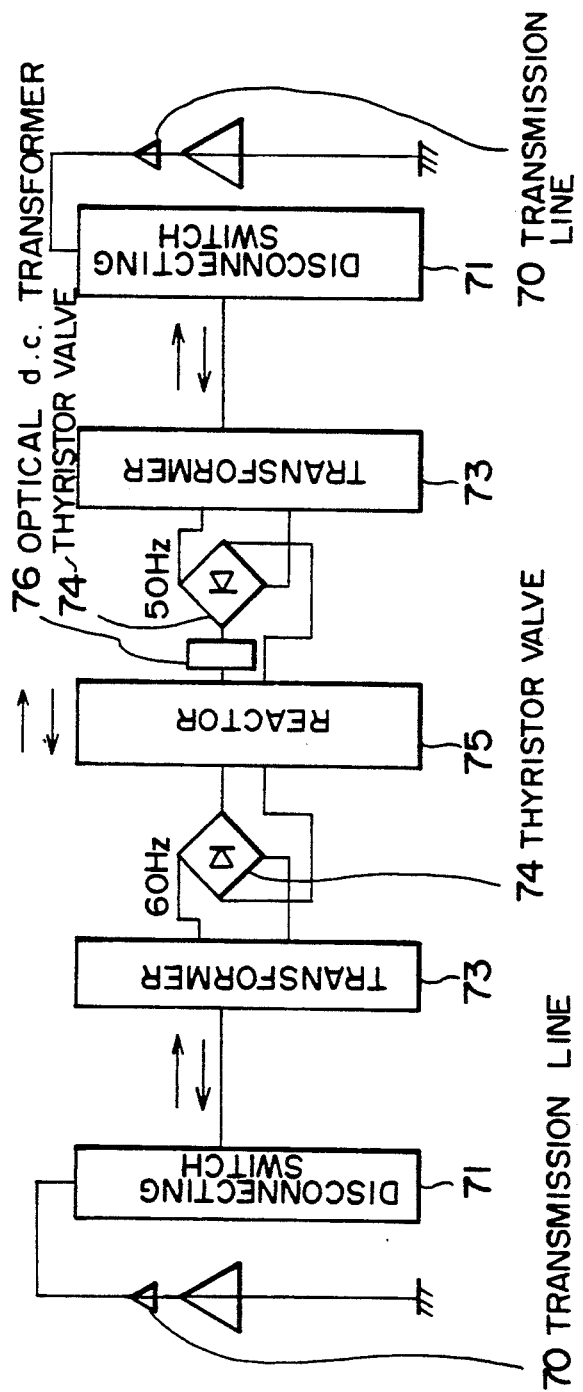
FIG. 13 is a diagram showing a frequency-conversion system substation to which the optical d.c. voltage transformer of the invention is incorporated.

FIG. 13 shows an example in which the optical d.c. transformer is used in a kind of substation, i.e., a frequency-conversion system substation.

In practice, assuming that a.c. power is to be supplied from the western Japan area, where power is 60 Hz, to the eastern Japan area, where power is 50 Hz, power supplying is impossible until a.c. power of 60 Hz is converted into d.c. power and then the frequency 60 Hz of this d.c. power is reduced to 50 Hz.

The system of FIG. 13 comprises, on either the 60 Hz side or the 50 Hz side, a transmission line 70, a disconnecting switch 71, a transformer 73 for conversion, a thyristor valve 74 (for rectification), and a reactor 75 located between the transformer 73 and the thyristor valve 74 for smooth rectification.

With this construction, when supplying power from 60 Hz side to 50 Hz side, a.c. power of 60 Hz is rectified into d.c. power through the thyristor valve 74 (action of inverter), whereupon such d.c. power is supplied to 50 Hz side after smoothed in the reactor 75 where ripples and the like of the d.c. power are removed. Subsequently, by the thyristor valve 74 (action of converter) on 50 Hz side, this d.c. power is converted into a.c. power of 50 Hz, and then the a.c. power is transmitted to 50 Hz side through the transformer 73.

The optical d.c. transformer 76 is located between the thyristor valve 74 and the reactor 75 in this system. If an abnormality signal (change of voltage) occurs in the system, the transformer 76 detects the abnormality signal and then produces an output signal to activate a relay, thus enabling protection and control of the power system.

What is claimed is:

1. An optical d.c. voltage transformer comprising:
   (a) a luminous source for outputting a constant d.c. level of light;
   (b) a polarizer for polarizing the light received from said luminous source;
   (c) an electrooptic medium to which a d.c. electrical field or voltage to be measured is to be applied, said electrooptic medium affecting the polarized light from said polarizer by an electrooptical effect to a degree proportional to the strength of the electrical field or voltage;
   (d) a photodetector for producing an optical signal proportional to the affected light received from said electrooptic medium;
   (e) a device for converting the optical signal from said photodetector into an electrical signal;
   (f) a chopper for pulsating the electrical field or voltage, which is to be applied to said electrooptic medium, in terms of time;
   (g) a detector for demodulating the electrical signal from said converting device in synchronism with the pulsated electrical field or voltage; and
   (h) an output unit for presenting the demodulated electrical signal similar in polarity to the electrical field or voltage to be measured.

2. An optical d.c. transformer according to claim 1 wherein in a substation measurement of a d.c. voltage is performed by using said optical d.c. voltage transformer.

3. An optical d.c. voltage transformer according to claim 1 being provided in a frequency conversion system for measurement of a d.c. voltage.

4. An optical d.c. voltage transformer comprising:
   (a) a voltage detecting block including a luminous source for outputting a constant d.c. level of light, a polarizer for polarizing the light received from said luminous source, an electrooptic medium to which a d.c. electrical field or voltage to be measured is to be applied, said electrooptic medium affecting the polarized light from said polarizer by an electrooptical effect to a degree proportional to the strength of the electrical field or voltage, and a chopper for pulsating the electrical field or voltage, which is to be applied to said electrooptic medium, in terms of time;
   (b) a signal processing block including a device for converting the optical signal from said photodetector into an electrical signal, a detector for demodulating the electrical signal from said converting device in synchronism with the pulsated electrical field or voltage, and an output unit for visually presenting the demodulated electrical signal similar in polarity to the electrical field or voltage to be measured; and
   (c) said voltage detecting block and said signal processing blocks being electrically separated from each other and being operatively joined with each other by using an optical means.

5. An optical d.c. transformer according to claim 4 being provided in a substation for measurement of a d.c. voltage.

6. An optical d.c. voltage transformer according to claim 4 being provided in a frequency conversion system for measurement of a d.c. voltage.

7. A d.c. voltage measuring system, comprising:
   (a) a voltage divider for dividing an electrical field or voltage, to be measured, into two or more separate electrical signals to be measured separately in two or more routes; and
   (b) a plurality of optical d.c. voltage transformers correspondingly provided in said routes for measurement of a respective one of the separate electrical signals;
   wherein each optical d.c. voltage transformer includes:
   (c) a luminous source for outputting a constant d.c. level of light,
   (d) a polarizer for polarizing the light received from said luminous source,
   (e) an electrooptic medium to which a d.c. electrical field or voltage to be measured is to be applied, said electrooptic medium affecting the polarized light from said polarizer by an electrooptical effect to a degree proportional to the strength of the electrical field or voltage,
   (f) a photodetector for producing an optical signal proportional to the affected light received from said electrooptic medium,
   (g) a device for converting the optical signal from said photodetector into an electrical signal,
   (h) a chopper for pulsating the electrical field or voltage, which is to be applied to said electrooptic medium, in terms of time,
   (i) a detector for demodulating the electrical signal from said converting device in synchronism with the pulsated electrical field or voltage, and
   (j) an output unit for presenting the demodulated electrical signal similar in polarity to the electrical field or voltage to be measured.

8. A d.c. voltage measuring system according to claim 3 being provided a substation for measurement of a d.c. voltage.

9. A d.c. voltage measuring system according to claim 7, further comprising:
   a common oscillator for causing all of said choppers and all of said detectors of said optical d.c. voltage transformers to perform the pulsating and the demodulating, respectively, in synchronism with each other.

10. A d.c. voltage measuring system according to claim 9, wherein said voltage divider has a bleeder resistance preset to such a high level as to determine the voltage to be inputted to each transformer.

11. A d.c. voltage measuring system according to claim 7, wherein said voltage divider has a bleeder resistance preset to such a high level as to determine the voltage to be inputted to each transformer.

12. A d.c. voltage measuring system according to claim 7 being provided in a frequency conversion system for measurement of a d.c. voltage.

13. A d.c. voltage measuring system comprising:
(a) a voltage divider for dividing an electrical field or voltage, to be measured, into two or more separate electrical signals to be measured separately in two or more routes; and
(b) a plurality of optical d.c. voltage transformers correspondingly provided in said routes for measurement of a respective one of the separate electrical signals;
wherein each optical d.c. voltage transformer includes:
(c) a voltage detecting block including a luminous source for outputting a constant d.c. level of light, a polarizer for polarizing the light received from said luminous source, an electrooptic medium to which a d.c. electrical field or voltage to be measured is to be applied, said electrooptic medium affecting the polarized light from said polarizer by an electrooptical effect to a degree proportional to the strength of the electrical field or voltage, and a chopper for pulsating the electrical field or voltage, which is to be applied to said electrooptic medium, in terms of time,
(d) a signal processing block including a device for converting the optical signal from said photodetector into an electrical signal, a detector for demodulating the electrical signal from said converting device in synchronism with the pulsated electrical field or voltage, and an output unit for visually presenting the demodulated electrical signal similar in polarity to the electrical field or voltage to be measured, and
(e) said voltage detecting block and said signal processing blocks being electrically separated from each other and being operatively joined with each other by using an optical means.

14. A d.c. voltage measuring system according to claim 11, further comprising:
a common oscillator for causing all of said choppers and all of said detectors of said optical d.c. voltage transformers to perform the pulsating and the demodulating, respectively, in synchronism with each other.

15. A d.c. voltage measuring system according to claim 14, wherein said voltage divider has a bleeder resistance preset to such a high level as to determine the voltage to be inputted to each transformer.

16. A d.c. voltage measuring system according to claim 13 being provided a substation for measurement of a d.c. voltage.

17. A d.c. voltage measuring system according to claim 13, wherein said voltage divider has a bleeder resistance preset to such a high level as to determine the voltage to be inputted to each transformer.

18. A d.c. voltage measuring system according to claim 13 being provided in a frequency conversion system for measurement of a d.c. voltage.

19. A d.c. voltage measuring instrument comprising:
(a) a luminous source for outputting a constant d.c. level of light;
(b) a polarizer for polarizing the light received from said luminous source;
(c) an electrooptic medium to which a d.c. electrical field or voltage to be measured is to be applied, said electrooptic medium affecting the polarized light from said polarizer by an electrooptical effect to a degree proportional to the strength of the electrical field or voltage;
(d) a photodetector for producing an optical signal proportional to the affected light received from said electrooptic medium;
(e) a device for converting the optical signal from said photodetector into an electrical signal;
(f) a chopper for pulsating the electrical field or voltage, which is to be applied to said electrooptic medium, in terms of time;
(g) a detector for demodulating the electrical signal from said converting device in synchronism with the pulsated electrical field or voltage; and
(h) an output unit for visually presenting the demodulated electrical signal similar in polarity to the electrical field or voltage to be measured.

20. An optical d.c. voltage measuring method comprising:
(a) outputting a constant d.c. level of light from a luminous source;
(b) polarizing the light from said luminous source by a polarizer;
(c) inputting the polarized light to an electrooptic medium;
(d) applying a d.c. electrical field or voltage to said electrooptic medium to affect the polarized light from said polarizer by an electrooptical effect of said electrooptic medium to a degree proportional to the strength of the electrical field or voltage;
(e) producing an optical signal proportional to the affected light received from said electrooptic medium, the produced optical signal having a pair of mutually orthotropic components;
(f) converting the resulting optical signal into an electrical signal;
(g) pulsating the electrical field or voltage, which is to be applied to said electrooptic medium, in terms of time;
(h) demodulating, after said producing, the electrical signal in synchronism with the pulsated electrical field or voltage; and
(i) presenting the demodulated electrical signal similar in polarity to the electrical field or voltage to be measured.

* * * * *